United States Patent [19]
Pyeon

[11] Patent Number: 5,991,228
[45] Date of Patent: Nov. 23, 1999

[54] SEMICONDUCTOR MEMORY DEVICE HAVING IMPROVED DATA OUTPUT CIRCUIT

[75] Inventor: Hong Beom Pyeon, Chungcheongbuk-do, Rep. of Korea

[73] Assignee: LG Semicon Co., Ltd., Chungcheongbuk-Do, DPR of Korea

[21] Appl. No.: 09/154,097

[22] Filed: Sep. 16, 1998

[30] Foreign Application Priority Data

Feb. 4, 1998 [KR]  Rep. of Korea .......................... 98-3065

[51] Int. Cl.⁶ ...................................................... G11C 8/00
[52] U.S. Cl. ...................................... 365/230.08; 365/194
[58] Field of Search .............................. 365/193, 189.01, 365/189.05, 194, 203, 230.08, 233.5

[56] References Cited

U.S. PATENT DOCUMENTS

| | | | |
|---|---|---|---|
| 4,794,567 | 12/1988 | Akatsuka | 365/189.05 |
| 4,894,803 | 1/1990 | Aizaki | 365/189.05 |
| 5,353,423 | 10/1994 | Hamid et al. | 395/425 |
| 5,526,320 | 6/1996 | Zagar et al. | 365/233 |
| 5,673,270 | 9/1997 | Tsujimoto | 365/230.08 |
| 5,815,437 | 9/1998 | Pascucci et al. | 365/189.05 |
| 5,831,908 | 11/1998 | Tsuji | 365/189.05 |
| 5,883,851 | 3/1999 | Lee | 365/193 |
| 5,889,707 | 3/1999 | Yang | 365/189.05 |

*Primary Examiner*—David Nelms
*Assistant Examiner*—Gene N Auduong
*Attorney, Agent, or Firm*—Morgan, Lewis & Bockius LLP

[57] ABSTRACT

A data out circuit of a DRAM includes a normal operation determining part receiving a RASB (row address strobe bar) and a CASB (column address strobe bar) to determine whether a normal operation or an abnormal operation to be performed, a write/read determining part determining whether a read operation or a write operation to be performed, a first delaying part generating an OEC (out enable control) signal to delay a DOE (data output enable) generation signal, a controlling part outputting an EQSWB (equalizer switch bar) to control the DOE to transit only a first transit of the CASB, and a switching part receiving signals from the first delaying part and the controlling part, and switching the DOE, and a DOE generating part receiving signals from the normal operation recognizing part and the write/read determining part, and the switching part to generate the DOE signal outputting only a valid data.

17 Claims, 6 Drawing Sheets

SEMICONDUCTOR MEMORY DEVICE HAVING IMPROVED DATA OUTPUT CIRCUIT

This application claims the benefit of Korean Application No. 98-3065 filed Feb. 4, 1998, which is hereby incorporated by reference.

BACKGROUND OF THE INVENTION

1. Field of the Invention

The present invention relates to a circuit of a semiconductor device, and more particularly, to a data out circuit of a DRAM. Although the present invention is suitable for a wide scope of applications, it is particularly suitable for improving a data out speed and providing a reliable data out circuit of a DRAM.

2. Discussion of the Related Art

An EDO (Extended Data Out) mode is generally used for an efficient and stable data out even in a short cycle for a high speed access to DRAM devices. The EDO mode employs a concept of a data latch for a faster cycling in a fast page mode, so that the first pipeline latch in the circuit is used to keep data out even when a CASB(Column Address Strobe Bar) is high. Accordingly, the data out circuit keeps outputting the present data until the next data out occurs following the address change, thereby making a stable data out even within a short cycle.

A background art data out circuit of a DRAM will be described with reference to FIG. 1 illustrating a block diagram illustrating a data out circuit of a DRAM according to a background art.

In the background art data out circuit of a DRAM of FIG. 1, a column address transition signal is not transmitted to a DOE(Data Output Enable) signal which controls a data out by opening a data out buffer in read operation. The data circuit includes a normal operation determining part 11, a write/read determining part 12, a delay part 13 and a DOE generating part 14.

The normal operation determining part 11 receives a RASB(Row Address Strobe Bar) and a CASB and determines whether it is a normal operation or an abnormal operation by transmitting the CASB to low and receiving the above column address. The normal operation is to read or write a data for a desired address whereas the abnormal operation is to determine a CBR(CAS before RAS), which is the CASB transits to low before the RASB transits to low.

The write/read determining part 12 receives a WEB(Write Enable Bar) and determines whether it is a read operation when the WEB is low, and it is a read operation when the WEB is high.

The operation of the aforementioned data out circuit of a DRAM will be describe with reference to FIG. 2.

As shown in FIG. 2, there are different pulses of RASB, CASB, address, EQMB (Equalizer Middle Bar), OEC (Out Enable Control), DOE (Data Output Enable),and an output data. If the normal operation determining part 11 determines it is a normal operation, the write/read determining part 12 determines it is a read when the RASB is transited to low in an EDO mode, a row address is received. Upon receiving the row address, a row system circuit is operated. If the CASB is transited to low, a column address is received and the DOE generating part 14 generates a DOE signal. Thus, a data out is ready to be executed according to outputs from the normal operation determining part 11, the write/read determining part 12 and the delay part 13. In other words, a data out is executed after satisfying a tCAA (Column Address Access Time).

When a tCAS (Column Address Setup Time)—a setup time between the column address and CASB—is −5 nS~+5 nS, the OEC of the delay part 13 is always high by receiving the high HPH. When the CASB becomes low, a data is outputted immediately since there is no control for the data out buffer. Consequently, an invalid data is outputted through the data out buffer in accordance with the CASB before outputting a valid data at an address designated presently. In other words, the valid data is outputted after the invalid data is outputted during the first cycle.

The background art data out circuits of a DRAM has the following problems.

In the data out circuit of a DRAM according to the background art, since a column address transition signal is not provided to the DOE, there is a delay in speed and an instability in system operation. This problem is caused by an invalid data provided during the first cycle coming from the outputted data when the CASB is transited to low since there is no data out buffer control.

Further, the background art data out circuit of a DRAM attempts to solve the problem caused by DOE not having a column address transition signal. However, the background art data out circuit data causes an invalid signal because a latch part is inoperative as the EQMB is high at the tASC of 7~9 nS, so that the tAA speed varies with the tASC. Accordingly, a system operation malfunction and a frequent transition of the DOE occurs in the background art data out circuit of the DRAM, thereby reducing a data out speed.

SUMMARY OF THE INVENTION

Accordingly, the present invention is directed a data out circuit of a DRAM that substantially obviates one or more of the problems due to limitations and disadvantages of the related art.

An object of the present invention is to provide a data out circuit of a DRAM which has an improved system operation speed and reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the data out circuit of a DRAM includes a DOE generating part adapted to receive data from a normal operation recognizing part and a write/read checking part for generating a DOE, a delaying part adapted to receive an EQMB and an HPH and generate an OEC for delaying DOE generation only to allow a valid data out, a controlling part adapted to receive a COB, an EQSO, a DOEKOB and a ROL to provide an EQSWB, for controlling the DOE to transit only on a first time transit of a CASB for the DOE to be provided to the DOE generating part, and a switching part for receiving the HPH, DOEKOB and EQSWB and switching the DOE.

In another aspect of the present invention, A data out circuit of a DRAM includes a normal operation determining part receiving a RASB (row address strobe bar) and a CASB (column address strobe bar) to determine whether a normal operation or an abnormal operation to be performed, a write/read determining part determining whether a read operation or a write operation to be performed, a first delaying part generating an OEC (out enable control) signal to delay a DOE (data output enable) generation signal, a controlling part outputting an EQSWB (equalizer switch bar) to control the DOE to transit only a first transit of the CASB, and a switching part receiving signals from the first delaying part and the controlling part, and switching the DOE, and a DOE generating part receiving signals from the normal operation recognizing part and the write/read determining part, and the switching part to generate the DOE signal outputting only a valid data.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
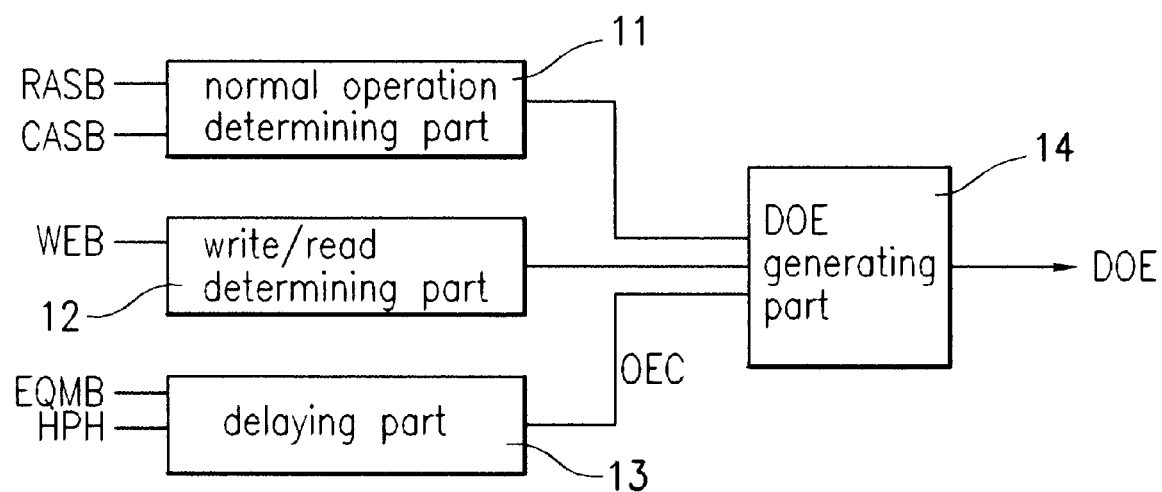
FIG. 1 is a block diagram illustrating a background art data out circuit of a DRAM.
Figure 2:
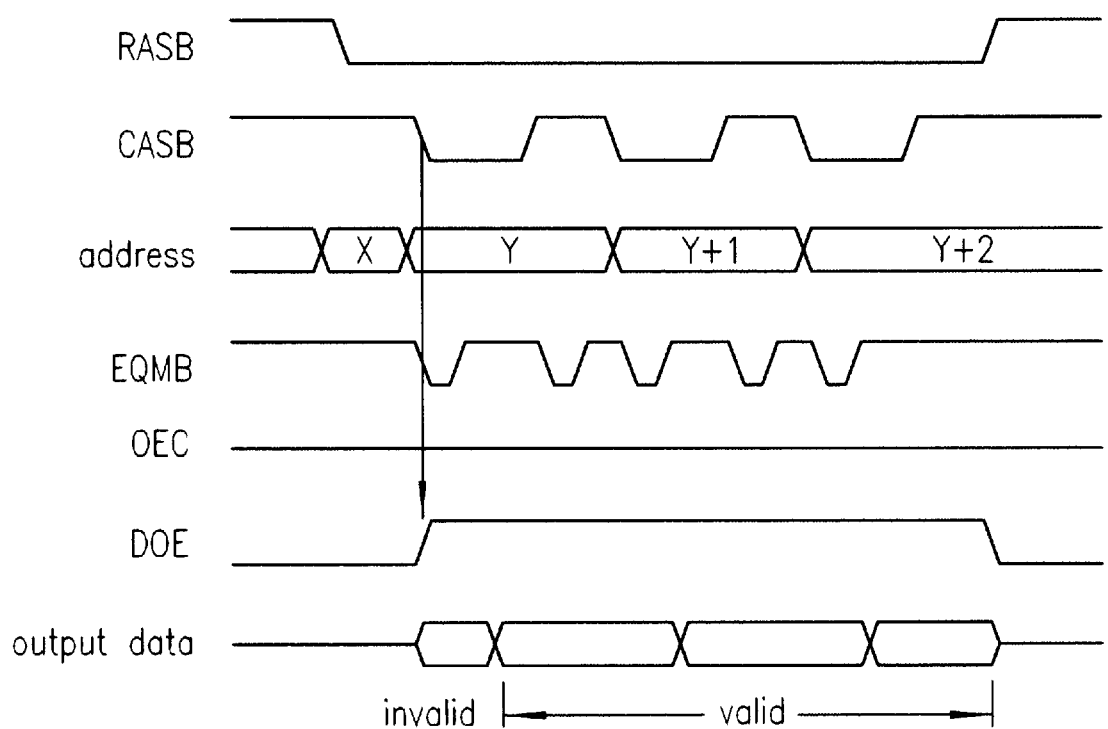
FIG. 2 is a timing diagram illustrating pulses generated in the background art data out circuit of FIG. 1.
Figure 3:
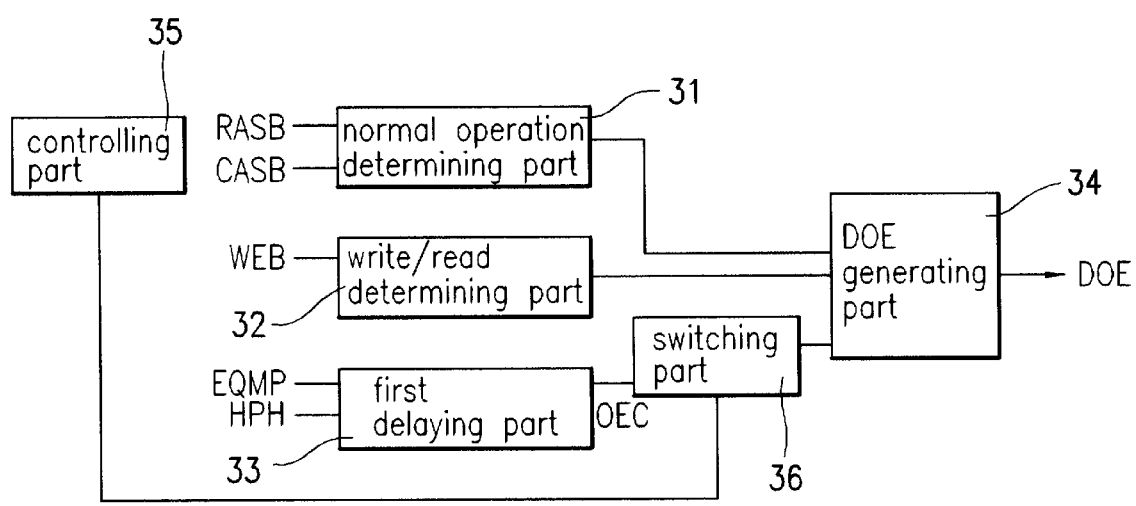
FIG. 3 is a block diagram illustrating a data out circuit of a DRAM in accordance with a preferred embodiment of the present invention.

FIG. 3 illustrates a block diagram of a data out circuit of a DRAM in accordance with a preferred embodiment of the present invention.

Referring to FIG. 3, the data out circuit of a DRAM in accordance with a preferred embodiment of the present invention includes a normal operation determining part 31, a write/read determining part 32, a first delaying part 33, a DOE generating part 34, a controlling part 35, and a switching part 36. The first delaying part 33 and the controlling part 35 are connected to the DOE generating part 34 through the switching part 36.

Specifically, the normal operation determining part 31 receives a RASB and a CASB and determines whether it is a normal operation or an abnormal operation. The normal operation is to read or write a data for a desired address 5 after receiving a row address with transiting the RASB to low and receiving a column address with transiting the CASB to low. Conversely, an abnormal operation is a CBR, which is the CASB is transited to low before the RASB is transited to low.

The write/read determining part 32 receives a WEB and determines whether it is a write operation when the WEB is low or it is a read operation when the WEB is high.

The first delaying part 33 receives an EQMB (Equalizer Middle Bar) and a HPH (Hyper Mode High) and provides an OEC (Out Enable Control) to delay the DOE signal in the DOE generation part 34.

The DOE generating part 34 receives output data from the normal operation determining part 31, the write/read determining part 32 and the first delaying part 33 through the switching part 36, and provides a DOE signal.

Figure 4:
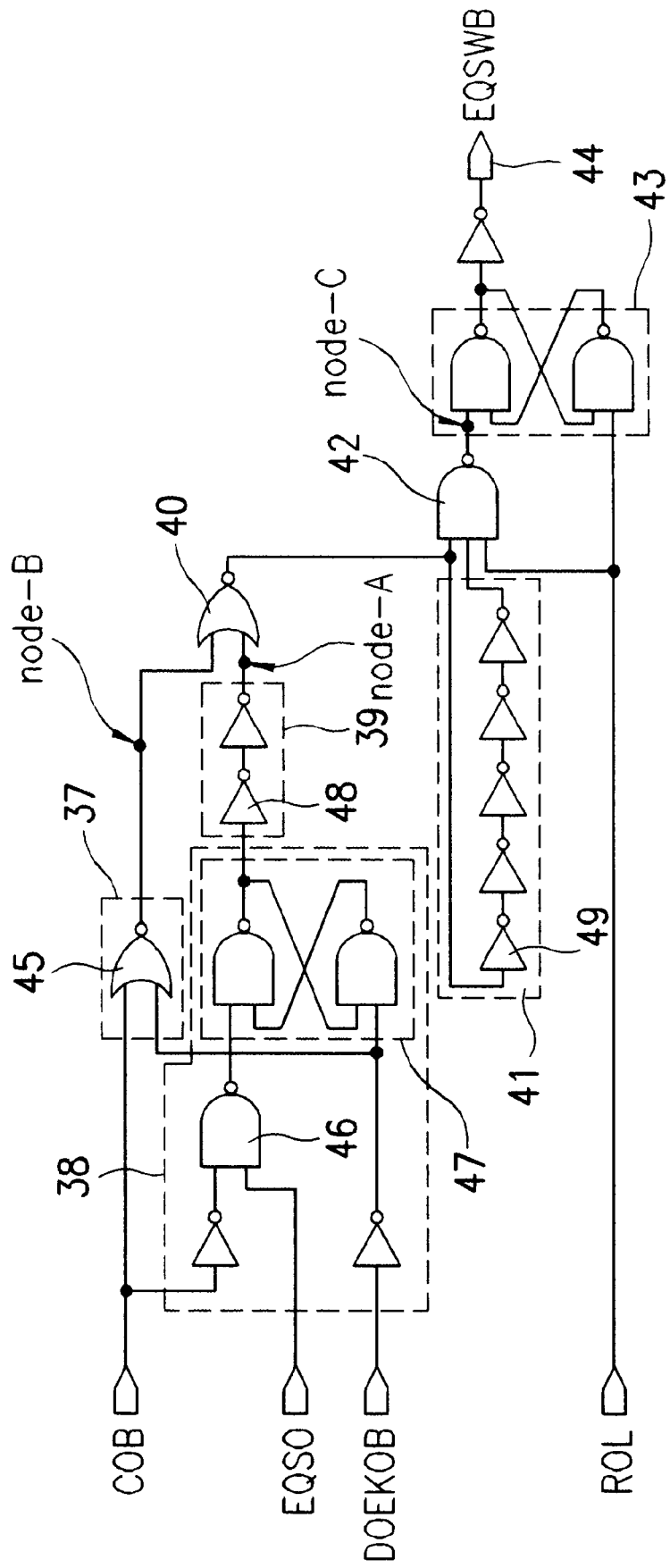
FIG. 4 is a circuit diagram of the control part shown in FIG. 3.

The controlling part 35 of the present invention shown in FIG. 3 will be more fully described with reference to FIG. 4. The controlling part 35 includes a first recognizing part 37, a second recognizing part 38, a second delaying part 39, a first NOR gate 40, a pulse generating part 41, a first NAND gate 42, a pulse latching part 43 an out part 44, a second NOR gate 45, a second NAND gate 46, a latching part 47, a first inverter 48, and a second inverter 49. The controlling part 35 controls an output of an OEC from the first delaying part 33 of the DOE generating part 34.

The first recognizing part 37 in the controlling part 35 has a second NOR gate 45 adapted to receive a COB (column 0 bar) and a DOEKOB(Data Output Enable KOB) inverted by an inverter recognizing a first cycle when a tASC is equal to or greater than 5 nS, which is close to a Tcac.

The second recognizing part 38 has a second NAND gate 46 adapted to receive an EQS0 (Equalizer Start 0) and a COB inverted by an inverter, and a latching part 47 receiving a signal from the second NAND gate 46 and the DOEKOB inverted by the inverter for recognizing a first cycle when the tASC is equal to or smaller than 5 nS, which is at the address transition signal comes after the CASB.

The second delaying part 39 having two first inverters 48 safely overlaps the tAA signal and the tCAC signal when the tAA and the tCAC are satisfied simultaneously. The first NOR gate 40 is adapted to receive signals from the first recognizing part 37 and the second delaying part 39. The pulse generating part 41 has five inverters 49 for generating pulses using a signal from the first NOR gate 40. The first NAND gate 42 receives a signal from the first NOR gate 40 and the pulse generating part 41 and a R0L(RAS Zero Left).

The pulse latching part 43 receiving a signal from the first NAND gate 42 and the ROL keeps latching the pulses generated in the pulse generating part 41. The out part 44 is adapted to invert a signal from the pulse latching part 43, for providing an EQSWB(Equalizer Switch Bar).

Figure 5:
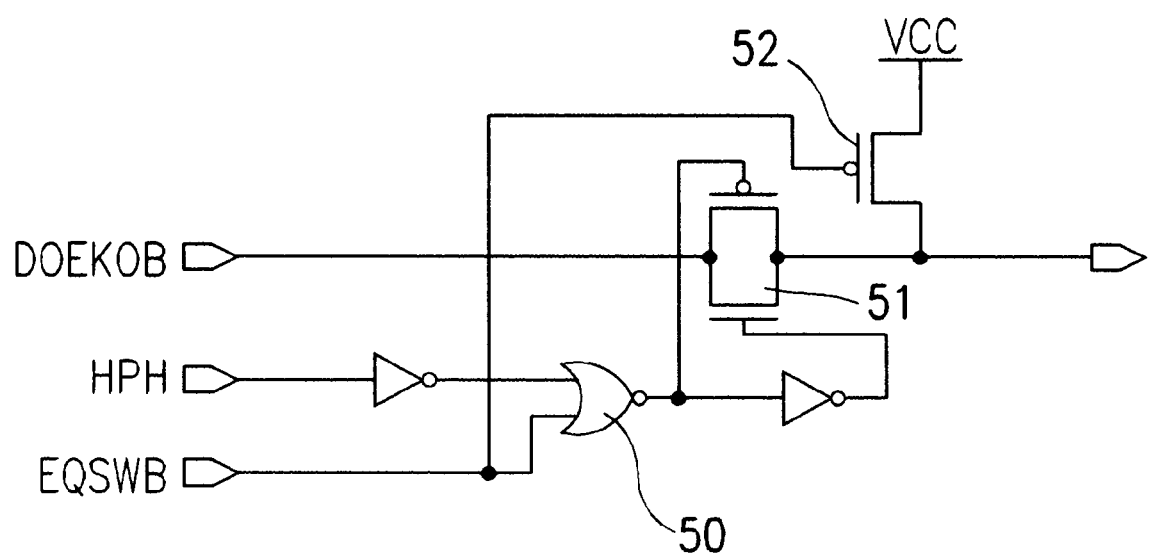
FIG. 5 is a circuit diagram of the switch part shown in FIG. 3.

As shown in FIG. 5, the switching part 36 includes a third NOR gate 50 adapted to receive an HPH inverted by an inverter and an EQSWB outputted from the controlling part 35, a transfer gate 51 receiving a signal from the third NOR gate 50 and the signal from the third NOR gate 50 inverted by an inverter and the DOEKOB, and a PMOS 52 having a gate electrode connected to the EQSWB, a drain connected to a signal from the transfer gate 51, and a source connected to a power source. The switching part 36 transmits the OEC to the DOE generating part 34 when the gate electrode is high (i.e., the EQSWB is high). Conversely, the OEC is not provided to the DOE generating part 34 by the PMOS 52 when the gate electrode is low, thereby providing the OEC from the first delaying part 33 to the DOE generating part 34 according to the controlling part 35.

The operation of the data out circuit of a DRAM in accordance with a preferred embodiment of the present invention will be explained with reference to FIG. 6.

Figure 6:
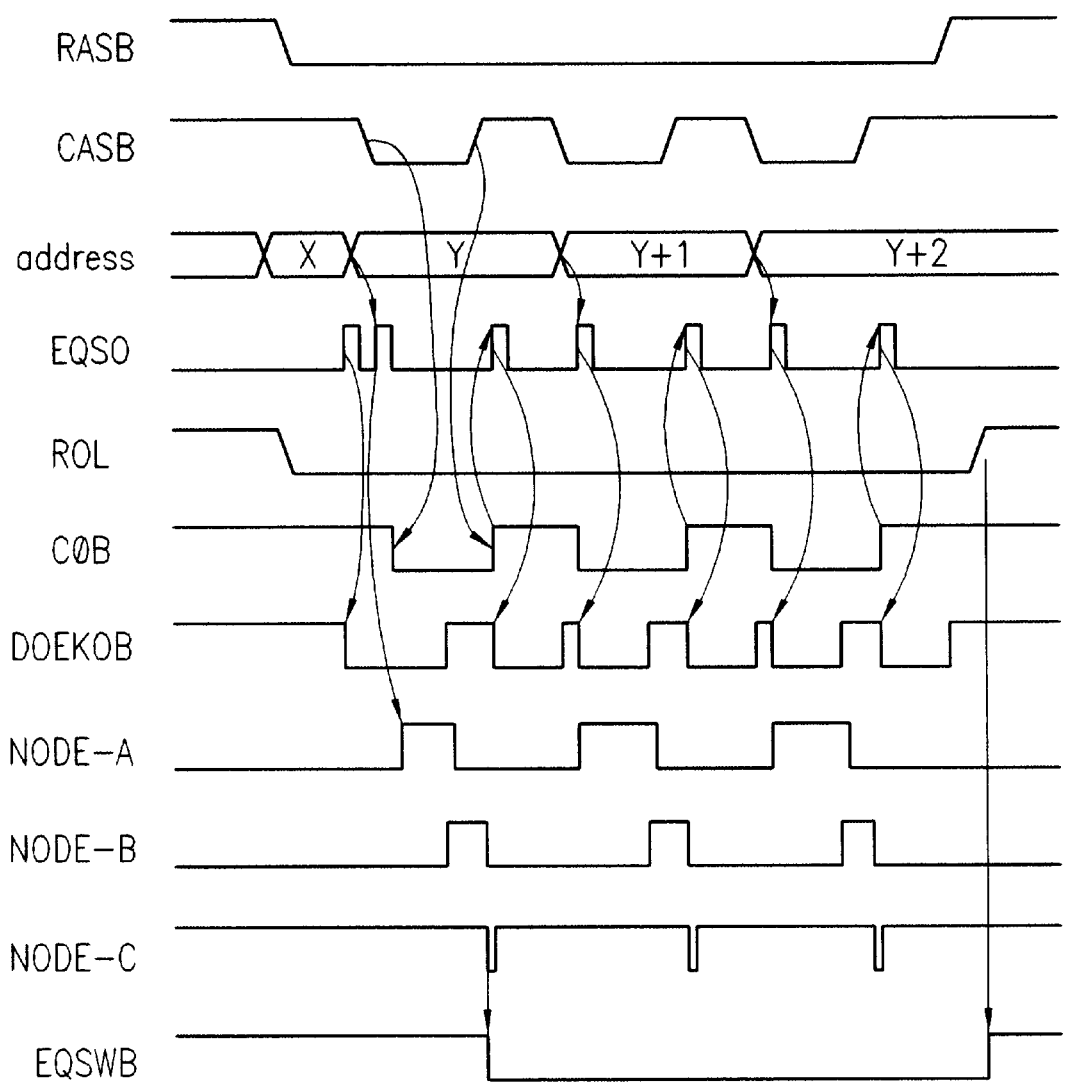
FIG. 6 is a timing diagram illustrating pulses at different parts of the circuit shown in FIG. 3.

In FIG. 6, there are different pulses of RASB, CASS, address, EQSO, ROL, C0B, DOEKOB, node A, node B, node C, and EQSWB. The node A (shown in FIG. 4) is at a signal between the second delaying part 39 after passing through the two inverters 48 and the first NOR gate 40. The node B (shown in FIG. 4) is at a signal between the first recognizing part 37 and the first NOR gate 40. The node C (shown in FIG. 4) is at a signal between the first NAND gate 42 and the pulse latching part 43.

In the data out circuit of a DRAM of the present invention, when the normal operation determining part 31, the write/read determining part 32 determine a normal operation and a read operation, respectively, in an EDO mode, the R0L signal of the pulse latching part 43 is transited to high to activate the pulse latching part 43 when the RASB is transited to low, thereby receiving the row address signal. A operation of the row system circuit is executed upon receiving the row address. When the CASB is transited to low, a column address is received.

In this instance, when the controlling part 35 detects a low transition of the CASB determining the first cycle, a pulse is generated. After storing the pulse in the pulse latching part 43, the controlling part 35 outputs an EQSWB, which is low, to the switching part 36. Soon after receiving the EQSWB (low), the switching part 36 switches a signal received from the first delaying part 33 and outputs a signal to the DOE generating part 34.

On the other hand, when a low transition of the CASB is not the first cycle, the first delaying part 33 delays the DOE signal generation of the DOE generating part 34 in response to the EQMB. Then, the DOE generating part 34 generates the DOE signal according to output values of the normal operation determining part 31, the write/read determining part 32, and the first delaying part, thereby setting for a data out. In other words, the data out is performed after the column address access time, tAA.

As described above, the data out circuit of a DRAM in the present invention further comprises a controlling part and a switching part. Thus, the controlling part recognizes a first cycle regardless of a tASC (whether the tASC is greater or less than 5 nS), overlaps a tAA and a tCAC (column address commanding time) when the tAA and the tCAC times are satisfied at the same time, generates pulses, and latches the pulses continuously, thereby providing an EQSWB to output a pulse only when a CASB is low for the first cycle. The switching part provides a signal from a delaying part which receives an address transition signal and delays a DOE signal generation of the DOE generating part. Accordingly, the present invention improves a data out speed and a reliability of a data out circuit of a DRAM because a DOE is transited only when the CASB is low, thereby suppressing a generation of an invalid data.

It will be apparent to those skilled in the art that various modifications and variations can be made in the data out circuit in a DRAM of the present invention without departing from the spirit or scope of the invention. Thus, it is intended that the present invention cover the modifications and variations of this invention provided they come within the scope of the appended claims and their equivalents.

What is claimed is:

1. A semiconductor device having a data output circuit, comprising:
    a normal operation determining part receiving a RASB (row address strobe bar) and a CASB (column address strobe bar) to determine whether a normal operation or an abnormal operation is to be performed;
    a write/read determining part determining whether a read operation or a write operation is to be performed;
    a first delaying part generating an OEC (out enable control) signal to delay a DOE (data output enable) signal;
    a controlling part outputting an EQSWB (equalizer switch bar) to control the DOE signal to transit only a first transit of the CASB, wherein the controlling part is not directly connected to the first delaying part;
    a switching part receiving signals from the first delaying part and the controlling part, and switching the DOE signal; and
    a DOE generating part receiving signals from the normal operation recognizing part, the write/read determining part, and the switching part to generate the DOE signal and outputting only valid data.

2. The semiconductor device according to claim 1, wherein the write/read determining part receives a WEB (write enable bar).

3. The semiconductor device according to claim 1, wherein the first delaying part receives an EQMB (equalizer middle bar) and an HPH (hyper mode high).

4. The semiconductor device according to claim 1, wherein the controlling part receives a C0B (column 0 bar), an EQS0 (equalizer start 0), a DOEKOB (data output enable KOB) and a R0L (RAS zero left).

5. The semiconductor device according to claim 1, wherein the controlling part comprises;
    a first recognizing part recognizing a first cycle when a tASC (column address setup time) is equal to or greater than 5 nS,
    a second recognizing part coupled to the first recognizing part and recognizing the first cycle when the tASC is equal to or smaller than 5 nS,
    a second delaying part coupled to the second recognizing part and safely overlapping signals for a tAA (column address access time) and a tCAC (column address commanding time) at the same time when the tAA and the tCAC are satisfied at the same time,
    a first NOR gate receiving signals from the first recognizing part and the second delaying part and executing a NOR operation,
    a pulse generating part generating a pulse using a signal from the first NOR gate,
    a first NAND gate receiving signals from the first NOR gate, the pulse generating part, and a R0L (RAS zero left), and executing a NAND operation,
    a pulse latching part receiving a signal from the first NAND gate and latching the pulse generated from the pulse generating part, and
    a data out part inverting a signal from the pulse latching part to provide the EQSWB.

6. The semiconductor device according to claim 5, wherein the first recognizing part includes a second NOR gate receiving a C0B (column 0 bar) and a DOEKOB (data output enable KOB) inverted by a first inverter.

7. The semiconductor device according to claim 5, wherein the second recognizing part includes a second NAND gate receiving an EQS0 (equalizer start 0) and a C0B (column 0 bar) inverted by a second inverter, and a latching part receiving a signal from the second NAND gate and the DOEKOB and latching the signals.

8. The semiconductor device according to claim 5, wherein the second delaying part includes third and fourth inverters.

9. The semiconductor device according to claim 5, wherein the pulse generating part includes fifth, sixth, seventh, eighth, and ninth inverters.

10. The semiconductor device according to claim 1, wherein the switching part comprises;
    a third NOR gate receiving an HPH (hyper mode high) inverted by a tenth inverter and the EQSWB from the controlling part, a transfer gate receiving a signal from the third NOR gate, the signal from the third NOR gate inverted by an eleventh inverter and a DOEKOB (data output enable KOB), and a PMOS transistor having a gate connected to the EQSWB, a drain connected to a signal from the transfer gate and a source connected to a power source.

11. A semiconductor device having a data output circuit, comprising:

a normal operation determining part receiving a RASB (row address strobe bar) and a CASB (column address strobe bar) to determine whether a normal operation or an abnormal operation to be performed;

a write/read determining part receiving a WEB (write enable bar) and determining whether a read operation or a write operation to be performed;

a first delaying part receiving an EQMB (equalizer middle bar) and an HPH (hyper mode high) and generating an OEC (out enable control) signal to delay a DOE (data output enable) signal;

a controlling part receiving a COB (column 0 bar), an EQS0 (equalizer start 0), a DOEKOB (data output enable KOB) and a R0L (RAS zero left) and outputting an EQSWB (equalizer switch bar) to control the DOE signal to a first transit of the CASB;

a switching part receiving signals from the first delaying part and the controlling part, and switching the DOE signal; and a DOE generating part receiving signals from the normal operation recognizing part, the write/read determining part, and the switching part for generating the DOE signal only when the CASB is low.

12. The semiconductor device according to claim 11, wherein the controlling part comprises;

a first recognizing part recognizing a first cycle when a tASC (column address setup time) is equal to or greater than 5 nS, a second recognizing part coupled to the first recognizing part and recognizing the first cycle when the tASC is equal to or smaller than 5 nS, a second delaying part coupled to the second recognizing part and safely overlapping signals for a tAA (column address access time) and a tCAC (column address commanding time) at the same time when the tAA and the tCAC are satisfied at the same time, a first NOR gate receiving signals from the first recognizing part and the second recognizing part and executing a NOR operation, a pulse generating part generating a pulse using a signal from the first NOR gate, a first NAND gate receiving signals from the first NOR gate, the pulse generating part, and a R0L (RAS zero left), and executing a NAND operation, a pulse latching part receiving a signal from the first NAND gate and latching the pulse generated from the pulse generating part, and a data out part inverting a signal from the pulse latching part to provide the EQSWB.

13. The semiconductor device according to claim 12, wherein the first recognizing part includes a second NOR gate receiving a C0B (column 0 bar) and a DOEKOB (data output enable KOB) inverted by a first inverter.

14. The semiconductor device according to claim 12, wherein the second recognizing part includes a second NAND gate receiving an EQSO (equalizer start 0) and a COB (column 0 bar) inverted by a second inverter, and a latching part receiving a signal from the second NAND gate and the DOEKOB and latching the signals.

15. The semiconductor device according to claim 12, wherein the second delaying part includes third and fourth inverters.

16. The semiconductor device according to claim 12, wherein the pulse generating part includes fifth, sixth, seventh, eighth, and ninth inverters.

17. The semiconductor device according to claim 11, wherein the switching part comprises;

a third NOR gate receiving an HPH (hyper mode high) inverted by a tenth inverter and the EQSWB from the controlling part, a transfer gate receiving a signal from the third NOR gate, the signal from the third NOR gate inverted by an eleventh inverter and a DOEKOB (data output enable KOB), and a PMOS transistor having a gate connected to the EQSWB, a drain connected to a signal from the transfer gate and a source connected to a power source.

* * * * *